US012751054B2

(12) United States Patent
Asra et al.

(10) Patent No.: US 12,751,054 B2
(45) Date of Patent: Sep. 29, 2026

(54) HIGH VOLTAGE BREAKDOWN RESISTANT BIPOLAR TRANSISTOR

(71) Applicant: Newport Fab, LLC, Newport Beach, CA (US)

(72) Inventors: Ram Asra, Irvine, CA (US); Edward Preisler, San Clemente, CA (US)

(73) Assignee: Newport Fab, LLC, Newport Beach, CA (US)

( * ) Notice: Subject to any disclaimer, the term of this patent is extended or adjusted under 35 U.S.C. 154(b) by 398 days.

(21) Appl. No.: 18/240,721

(22) Filed: Aug. 31, 2023

(65) Prior Publication Data

US 2025/0081547 A1 Mar. 6, 2025

(51) Int. Cl.
*H10D 62/10* (2025.01)
*H10D 10/00* (2025.01)
(Continued)

(52) U.S. Cl.
CPC ........... *H10D 62/109* (2025.01); *H10D 10/00* (2025.01); *H10D 10/01* (2025.01); *H10D 62/115* (2025.01);
(Continued)

(58) Field of Classification Search
CPC ...... H10D 10/00; H10D 10/01; H10D 10/051; H10D 10/056; H10D 10/061; H10D 10/40; H10D 10/421; H10D 10/441; H10D 10/60; H10D 10/821; H10D 10/891; H10D 62/10; H10D 62/104; H10D 62/105; H10D 62/108; H10D 62/115; H10D 62/138; H10D 62/107; H10D 62/109; H10D 62/111; H10D 62/113; H10D 10/021; H10D 10/041; H10D 10/054; H10D 10/80; H10D 84/121; H10D 84/611; H10D 84/619; H10D 84/641; H10D 62/133; H10D 62/137; H10D 62/177; H10D 62/82; H10D 62/822; H10D 62/832; H10D 64/231; H10D 64/281; H10D 89/711; H10D 89/713; H01L 23/34; H01L 23/345; H01L 23/481; H01L 21/26513; H01L 21/76224;
(Continued)

(56) References Cited

U.S. PATENT DOCUMENTS

2003/0107051 A1* 6/2003 Park ..................... H10D 10/021 257/E29.193
2004/0032005 A1* 2/2004 Williams ........... H10D 84/0114 257/E21.612
(Continued)

OTHER PUBLICATIONS

Melai et al., A New Sub-Micron 24 V SiGe:C Resurf HBT, 2004, Proc, of Int. Symp. on Power Semiconductor Devices, IEEE, pp. 33-36. (Year: 2004).*

*Primary Examiner* — Natalia A Gondarenko
(74) *Attorney, Agent, or Firm* — Farjami & Farjami LLP

(57) ABSTRACT

A bipolar transistor includes a sub-collector doped with a first dopant type and situated in a semiconductor substrate, a device layer doped with the first dopant type situated over the sub-collector, and a shallow trench isolation (STI) situated in the device layer and bordering a collector of the bipolar transistor. The bipolar transistor further includes a Reduced Surface Layer (RESURF) region doped with a second dopant type opposite the first dopant type situated between the collector and the STI, wherein the RESURF region protects against breakdown of the bipolar transistor.

19 Claims, 9 Drawing Sheets

(51) Int. Cl.
*H10D 10/01* (2025.01)
*H10D 62/13* (2025.01)
*H10P 30/20* (2026.01)

(52) U.S. Cl.
CPC ......... *H10D 62/138* (2025.01); *H10P 30/204* (2026.01); *H10P 30/21* (2026.01)

(58) Field of Classification Search
CPC .... H01L 21/764; H10P 30/204; H10P 30/208; H10P 30/21
USPC ....... 257/565, 370, 170, 197, 198, 200, 201, 257/586
See application file for complete search history.

(56) References Cited

U.S. PATENT DOCUMENTS

| | | | | |
|---|---|---|---|---|
| 2005/0250289 | A1* | 11/2005 | Babcock | H10D 10/041 257/E21.612 |
| 2010/0022056 | A1* | 1/2010 | Donkers | H10D 10/021 257/571 |
| 2014/0266407 | A1* | 9/2014 | Chen | H10D 62/109 438/335 |
| 2016/0233294 | A1* | 8/2016 | Babcock | H10D 62/138 |
| 2023/0268394 | A1* | 8/2023 | McTaggart | H10D 10/051 257/586 |
| 2024/0145462 | A1* | 5/2024 | Hwang | H10D 89/711 |

* cited by examiner

HIGH VOLTAGE BREAKDOWN RESISTANT BIPOLAR TRANSISTOR

BACKGROUND

For bipolar transistors, there is a well-known trade-off between breakdown voltage and speed, sometimes referred to as the Johnson limit. That is to say, the faster the device is, the lower its breakdown voltage, and vice versa. Bipolar transistors typically break down vertically in the collector, beneath the base. In very high breakdown devices used in power amplifiers, such as devices designed to withstand reverse bias voltages between the collector and base in the fifteen to thirty volt (15V-30V) range, non-traditional breakdown mechanisms may be observed. For example, despite reduction of dopant concentration in the collector to better sustain high voltage operation, lateral breakdown can occur.

Unfortunately, conventional techniques for rendering a bipolar transistor more voltage tolerant have proved substantially ineffective in preventing lateral breakdown, while undesirably reducing speed. Thus, there is a need in the art for a bipolar transistor structure that is resistant to lateral breakdown at high voltages without sacrificing device speed.

SUMMARY

The present disclosure is directed to a high voltage breakdown resistant bipolar transistor, substantially as shown in and/or described in connection with at least one of the figures, and as set forth in the claims.

DETAILED DESCRIPTION

Figure 1:
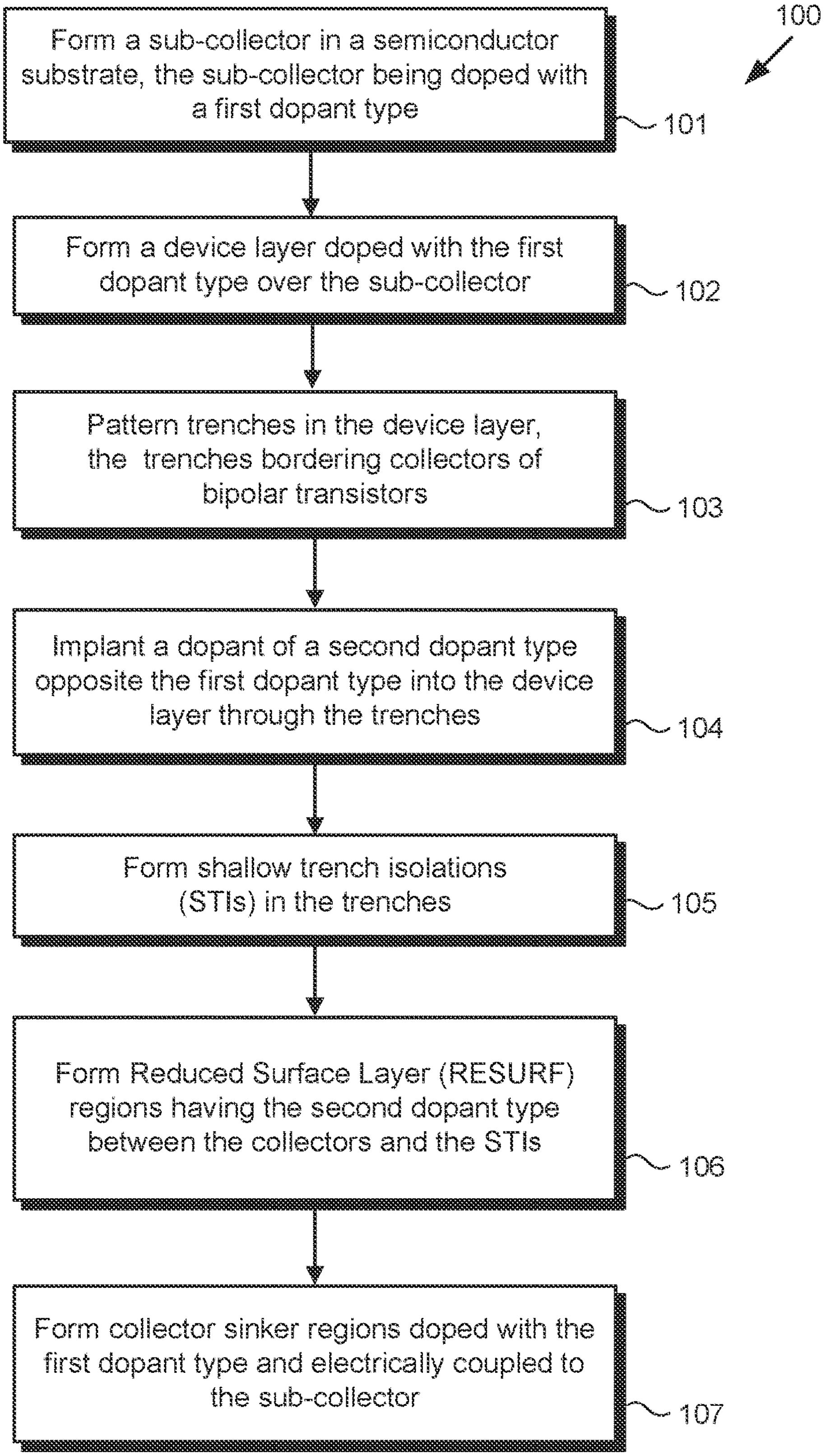
FIG. 1 shows a flowchart presenting an exemplary method for fabricating a high voltage breakdown resistant bipolar transistor, according to one implementation of the present application.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

As stated above, in very high breakdown bipolar transistors used in power amplifiers, such as devices designed to withstand reverse bias voltages between the collector and base in the fifteen to thirty volt (15V-30V) range, non-traditional breakdown mechanisms may be observed. For example, and as also stated above, despite reduction of dopant concentration in the collector to better sustain high voltage operation, lateral breakdown can occur. Unfortunately, however, conventional techniques for rendering a bipolar transistor more voltage tolerant have proved substantially ineffective in preventing lateral breakdown, while undesirably reducing speed.

The present application is directed to high voltage breakdown resistant bipolar transistors (hereinafter simply "bipolar transistors") and methods for their fabrication that address and overcome the problems in the art described above. In one implementation, such a bipolar transistor includes a sub-collector doped with a first dopant type and situated in a semiconductor substrate, a device layer doped with the first dopant type situated over the sub-collector, and a shallow trench isolation (STI) situated in the device layer and bordering a collector of the bipolar transistor. The bipolar transistor further includes a Reduced Surface Layer (RESURF) region doped with a second dopant type opposite the first dopant type situated between the collector and the STI, wherein the RESURF region protects against breakdown of the bipolar transistor. In various implementations, the breakdown voltage of such a device may be increased by up to three volts (3V) when compared with traditional bipolar transistors used in power amplifier applications, with a substantially negligible reduction in device speed.

FIG. 1 illustrates flowchart 100 of an exemplary method for forming a bipolar transistor, according to one implementation of the present application. Actions 101 through 107 shown in flowchart 100 of FIG. 1 are sufficient to describe one implementation of the present inventive concepts. Other implementations of the present inventive concepts may utilize actions different from those shown in flowchart 100. Certain details and features have been left out of flowchart 100 that are apparent to a person of ordinary skill in the art. For example, an action may consist of one or more subactions or may involve specialized equipment or materials, as known in the art. Moreover, some actions, such as masking and cleaning actions, are omitted so as not to distract from the illustrated actions.

Figure 2:
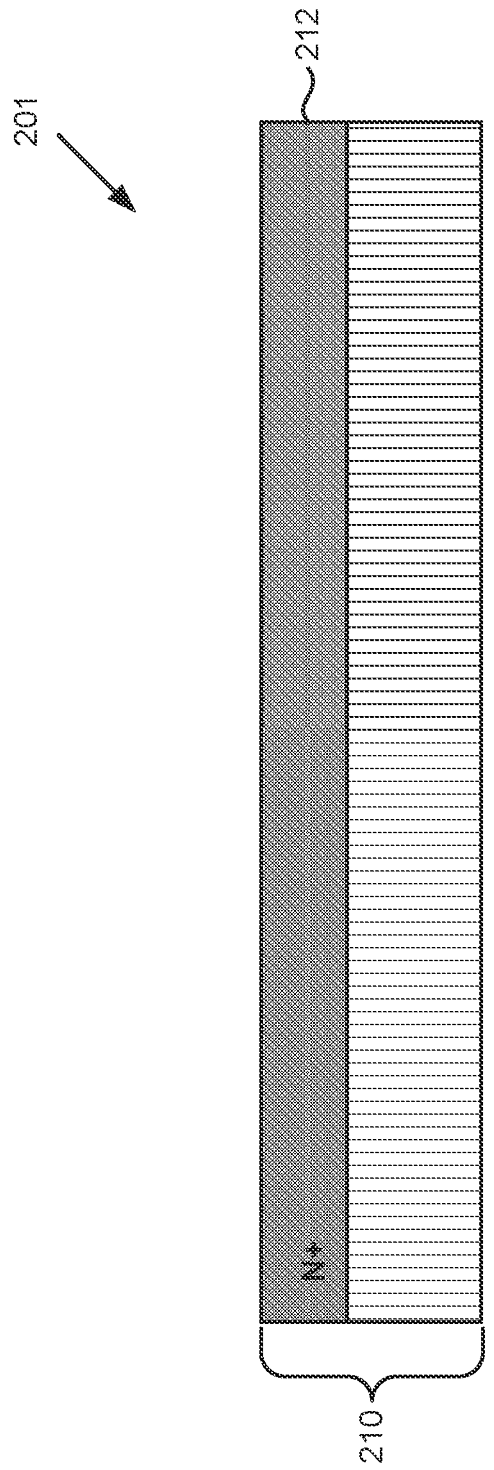
FIG. 2 shows a cross-sectional view of an exemplary structure corresponding to an initial fabrication action according to the flowchart of FIG. 1.
Figure 3:
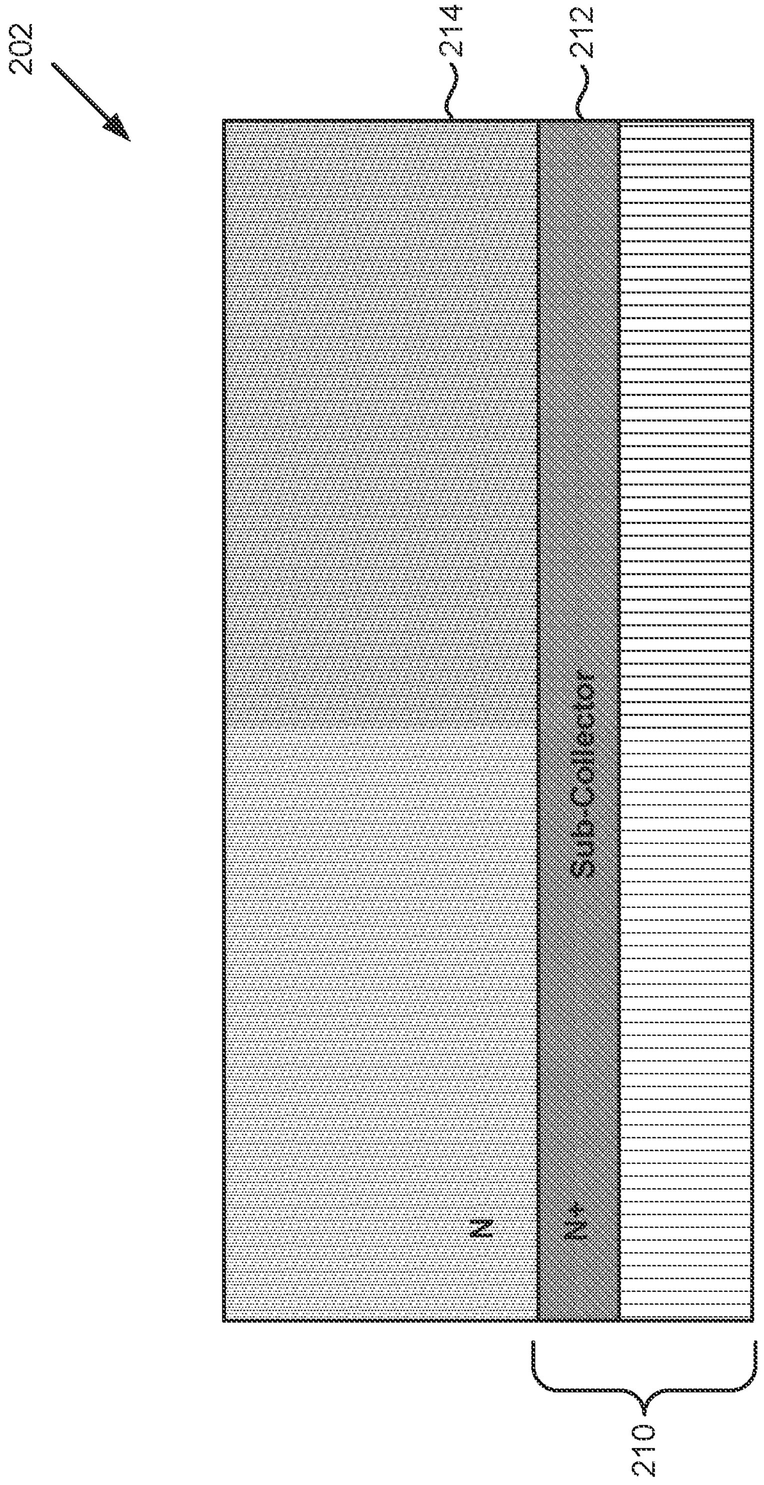
FIG. 3 shows a cross-sectional view of the exemplary structure of FIG. 2 at a subsequent fabrication action according to the flowchart of FIG. 1.
Figure 4:
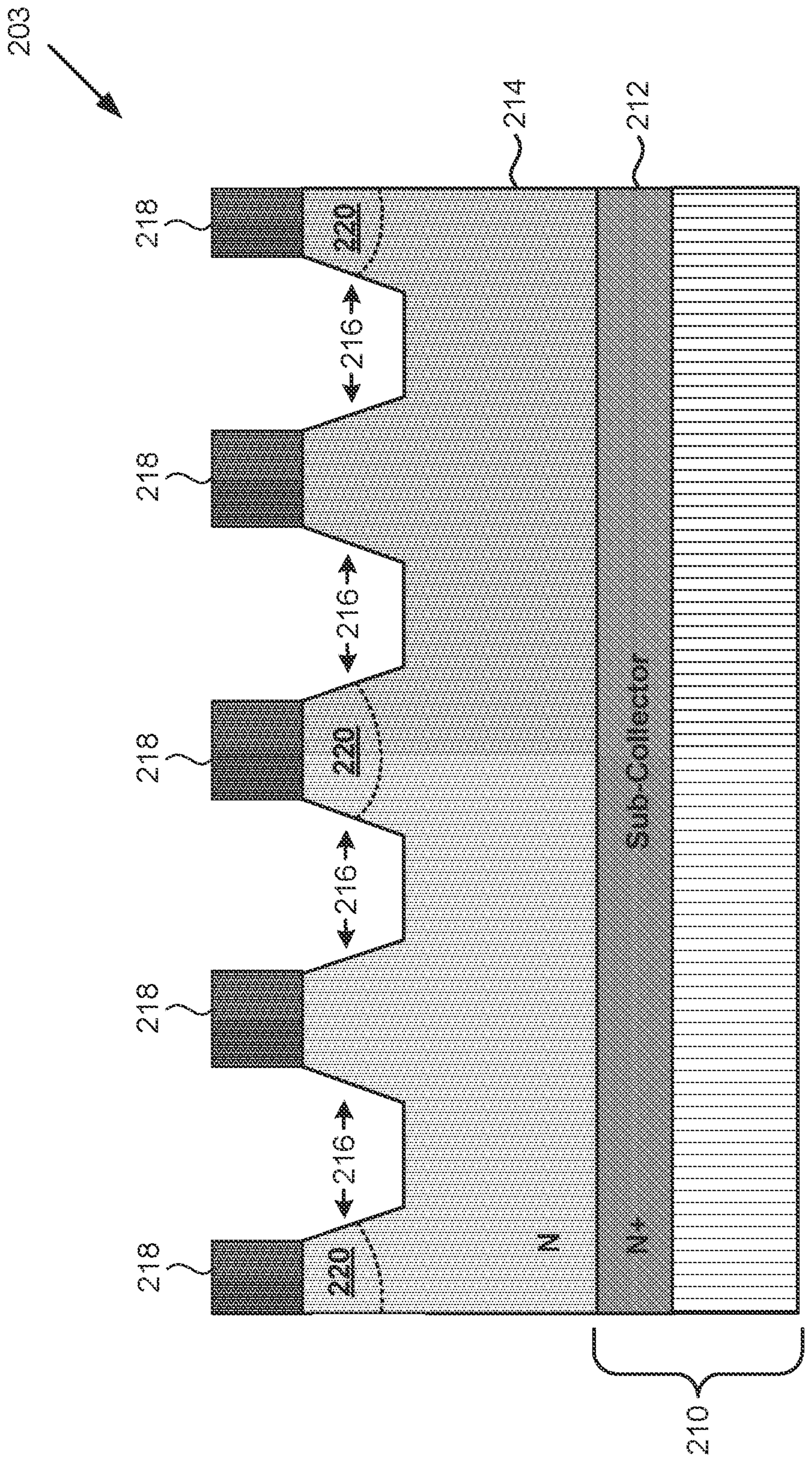
FIG. 4 shows a cross-sectional view of the exemplary structure of FIG. 3 at a subsequent fabrication action according to the flowchart of FIG. 1.

With respect to FIGS. 2, 3, 4, 5, 6, 7, and 8 (hereinafter "FIGS. 2-8"), structures 201, 202, 203, 204, 205, 206, and 207 shown respectively in FIGS. 2-8 illustrate the result of performing the method of flowchart 100, according to one implementation. For example, FIG. 2 provides a cross-sectional view of structure 201 including semiconductor substrate 210 in which N+ sub-collector 212 is formed (action 101). Structure 202, in FIG. 3, is a cross-sectional view of structure 201 after formation of N type device layer 214 over N+ sub-collector 212 (action 102). Structure 203, in FIG. 4, is a cross-sectional view of structure 202 after trenches 216 are patterned in device layer 214 (action 103), and so forth.

It is noted that the cross-sectional structures shown in FIGS. 2-8 are provided as specific implementations of the present inventive principles, and are shown with such specificity for the purposes of conceptual clarity. Consequently, particular details such as the materials used to form the cross-sectional structures shown in FIGS. 2-8, as well as the techniques used to produce the various depicted features, are being provided merely as examples, and should not be interpreted as limitations.

Referring to flowchart 100 in FIG. 1, in combination with FIG. 2, flowchart 100 begins with forming sub-collector 212 in semiconductor substrate 210, sub-collector 212 being doped with a first dopant type (action 101). Semiconductor substrate 210 may be an undoped silicon substrate, for example. As shown in FIG. 2, according to one exemplary implementation, semiconductor substrate includes N+ sub-collector formed therein. It is noted that although FIGS. 2-8 depict fabrication of an NPN bipolar transistor, that representation is provided merely as an example. In other implementations, a PNP bipolar transistor may be fabricated according to the present concepts through reversal of the dopant types depicted in FIGS. 2-8. Thus, in the case of a PNP bipolar transistor, action 101 for example, can correspond to forming a P+ sub-collector in semiconductor substrate 210.

Referring once again to the exemplary implementations in which an NPN bipolar transistor is fabricated, N+ sub-collector 212 may be formed in semiconductor substrate 210 through ion implantation and diffusion of N type dopants to form N+ sub-collector 212. For example, arsenic (As) may be implanted into semiconductor substrate and may be thermally driven to form N+ sub-collector 212 having a dopant concentration of approximately $10^{19}$ $cm^{-3}$ to $10^{20}$ $cm^{-3}$.

Moving to structure 202 in FIG. 3, with continued reference to flowchart 100, in FIG. 1, flowchart 100 continues with forming device layer 214 doped with the first dopant type (e.g., N type) over sub-collector 212 (action 102). Device layer 214 may be, for example, a silicon layer or a silicon-germanium (SiGe) layer. Thus, in various implementations the bipolar transistor fabricated according to the method outlined by flowchart 100 in FIG. 1, may be a silicon only bipolar transistor, or a SiGe bipolar transistor.

Device layer 214 may be formed using any suitable techniques known in the art. For example, device layer may be deposited or epitaxially grown using one of chemical vapor deposition (CVD) or molecular beam epitaxy (MBE). Alternatively, in some implementations, it may be advantageous or desirable to form device layer 214 using one of atomic layer deposition (ALD) or low energy plasma-enhanced chemical vapor deposition (LEPECVD).

According to the exemplary NPN bipolar transistor implementation shown in FIGS. 2-8, device layer 214 may be N type doped through ion implantation and diffusion of N type dopants. For example, phosphorus (P) may be implanted into device layer and may be annealed to form N type device layer 214 having a dopant concentration of approximately $10^{17}$ $cm^{-3}$ to $10^{18}$ $cm^{-3}$.

Continuing to structure 203 in FIG. 4, with continued reference to flowchart 100 in FIG. 1, flowchart 100 continues with patterning trenches 216 in device layer 214, where trenches 216 border respective collectors 220 of bipolar transistors undergoing fabrication according to the method outlined by flowchart 100 (action 103). Also shown in FIG. 4 is patterning mask 218 situated over and shielding portions of device layer 214 during the patterning of trenches 216. It is noted that patterning mask 218 may include a composite structure including a nitride stack having silicon dioxide ($SiO_2$) and silicon nitride ($Si_XN_Y$) layers, which may be deposited or thermally grown, overlaid by photoresist, for example.

Trenches 216 may be patterned in device layer 214 using any suitable techniques typically utilized in the art, such as an ion-reactive dry etching process, for example. As shown in FIG. 4, trenches 216 border and partially define collectors 220 within device layer 214. As noted above, according to the exemplary implementations shown by FIGS. 2-8, device layer 214 may be N type phosphorus doped to a dopant concentration of approximately $10^{17}$ $cm^{-3}$ to $10^{18}$ $cm^{-3}$. Consequently, collectors 220 defined within device layer 214 and having such a dopant concentration are one to two orders of magnitude less heavily doped than typical bipolar transistor collectors.

Figure 5:
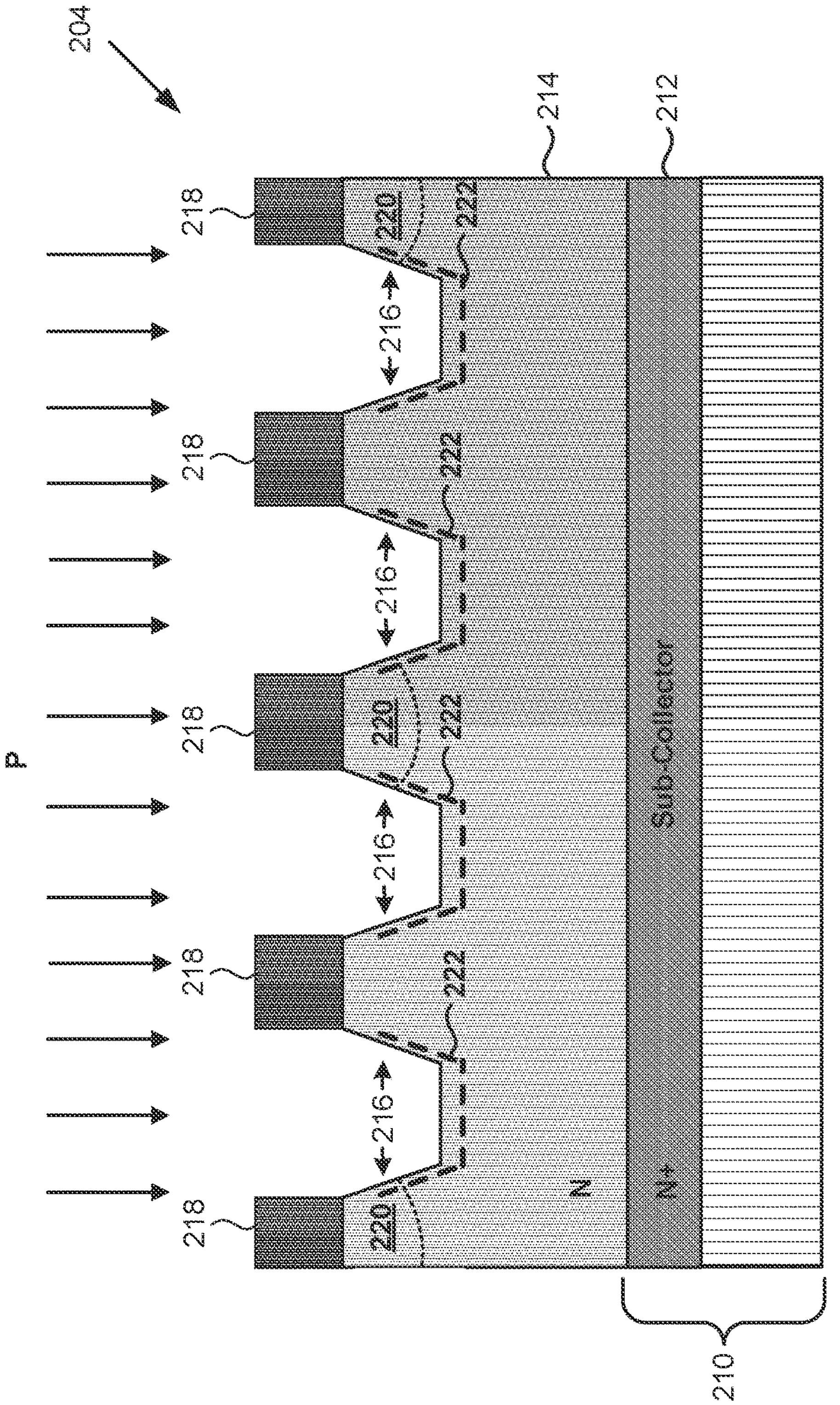
FIG. 5 shows a cross-sectional view of the exemplary structure of FIG. 4 at a subsequent fabrication action according to the flowchart of FIG. 1.

Continuing to structure 204 in FIG. 5, with continued reference to flowchart 100 in FIG. 1, flowchart 100 continues with implanting dopant 222 of a second dopant type opposite the first dopant type into device layer 214 through trenches 216 (action 104). According to the exemplary implementation shown in FIGS. 2-8, in which the first dopant type used to dope sub-collector 212 and device layer 214 is N type, the second dopant type implanted in action 104 is P type. For example, boron (B) dopant 222 may be implanted into device layer 214 through trenches 216 using an ion implantation energy of less than one hundred kilo-electron volts (100 keV) and an implantation concentration of less than $9\times10^{12}$ $cm^{-2}$.

It is noted that although the implementation shown in FIGS. 2-8 depicts fabrication of an NPN bipolar transistor in which the first dopant type used to dope sub-collector 212 and device layer 214 is N type, and the second dopant type implanted in action 104 is P type, in implementations in which a PNP bipolar transistor is fabricated according to the present concepts, the first dopant type used to dope sub-collector 212 and device layer 214 may be P type, and the second dopant type implanted in action 104 may be N type.

Figure 6:
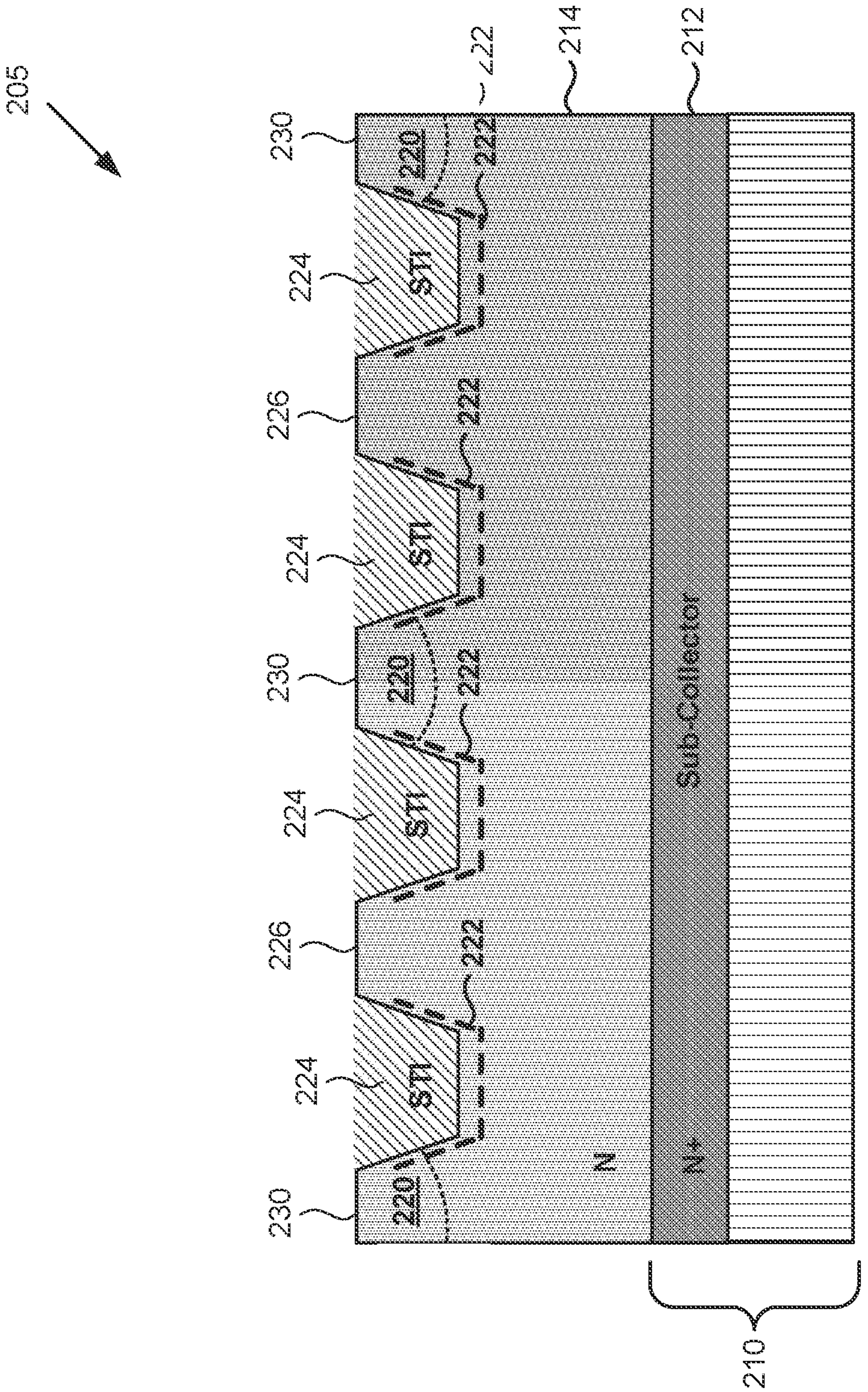
FIG. 6 shows a cross-sectional view of the exemplary structure of FIG. 5 at a subsequent fabrication action according to the flowchart of FIG. 1.

Continuing to structure 205 in FIG. 6, with continued reference to flowchart 100 in FIG. 1, flowchart 100 continues with forming a shallow trench isolations (STI) 224 in each of trenches 216 (action 105). STIs 224 may be formed by filling trenches 216 with a dielectric material, such as silicon dioxide, using CVD for example, followed by a chemical mechanical planarization (CMP) process to remove any excess dielectric material from the surface of device layer 214.

FIG. 6 also shows patterning mask 218 as having been removed to expose collector sinker mesas 226 and base mesas 230. It is noted that each of base mesas 230 will subsequently have a respective base of the bipolar transistors being fabricated in the process outlined by flowchart 100 situated thereon. It is further noted that each of collector sinker mesas 226 will subsequently have a respective collector sinker contact of the bipolar transistors being fabricated in the process outlined by flowchart 100 situated thereon.

Figure 7:
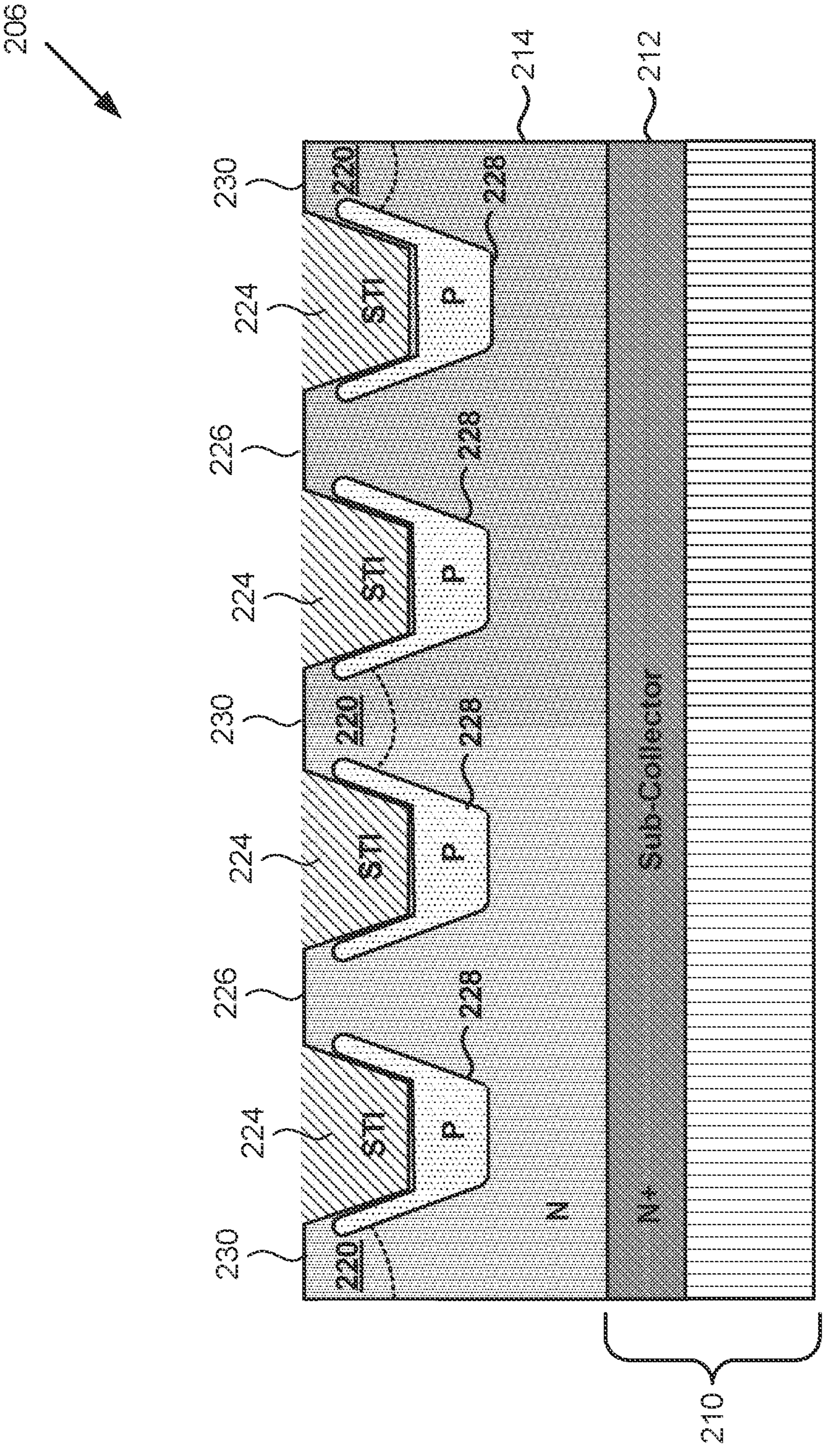
FIG. 7 shows a cross-sectional view of the exemplary structure of FIG. 6 at a subsequent fabrication action according to the flowchart of FIG. 1.

Continuing to structure 206 in FIG. 7, with continued reference to flowchart 100 in FIG. 1, flowchart 100 continues with forming RESURF regions 228 having the second dopant type between collectors 220 and STIs 224 (action 106). RESURF regions 228 may be formed through annealing of dopant 222 implanted into device layer 214 through trenches 216 in action 104.

Figure 8:
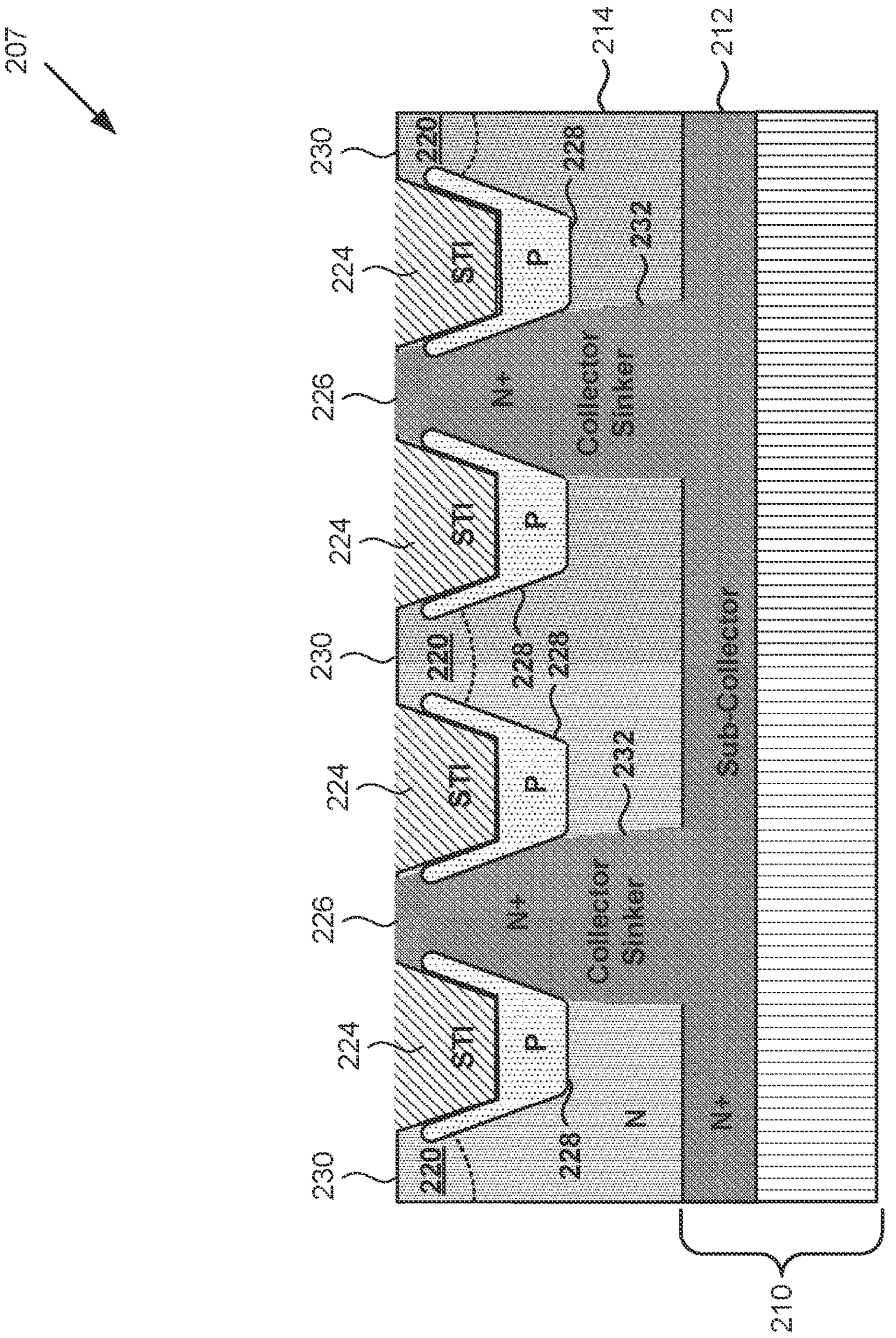
FIG. 8 shows a cross-sectional view of the exemplary structure of FIG. 7 at a subsequent fabrication action according to the flowchart of FIG. 1.

Continuing to structure 207 in FIG. 8, with continued reference to flowchart 100 in FIG. 1, flowchart 100 continues with forming collector sinker regions 232 doped with the first dopant type and electrically coupled to sub-collector 212 (action 107). According to the exemplary implementation shown by FIGS. 2-8, collector sinker regions 232 are formed as N+ regions of device layer 214 through additional ion implantation and thermal diffusion of N type dopants in collector-sinker regions 232 of device layer 214. For example, phosphorus (P) may be implanted into device layer 214 and may be annealed to form N+ collector sinker regions 232 having a dopant concentration of approximately $10^{19}$ $cm^{-3}$ to $10^{20}$ $cm^{-3}$.

It is noted once again that although FIGS. 2-8 depict fabrication of an NPN bipolar transistor, that representation is provided merely as an example. In other implementations, a PNP bipolar transistor may be fabricated according to the present concepts. Thus, in the case of a PNP bipolar transistor, action 107 for example, can correspond to forming a P+ collector sinker region in device layer 214.

Figure 9:
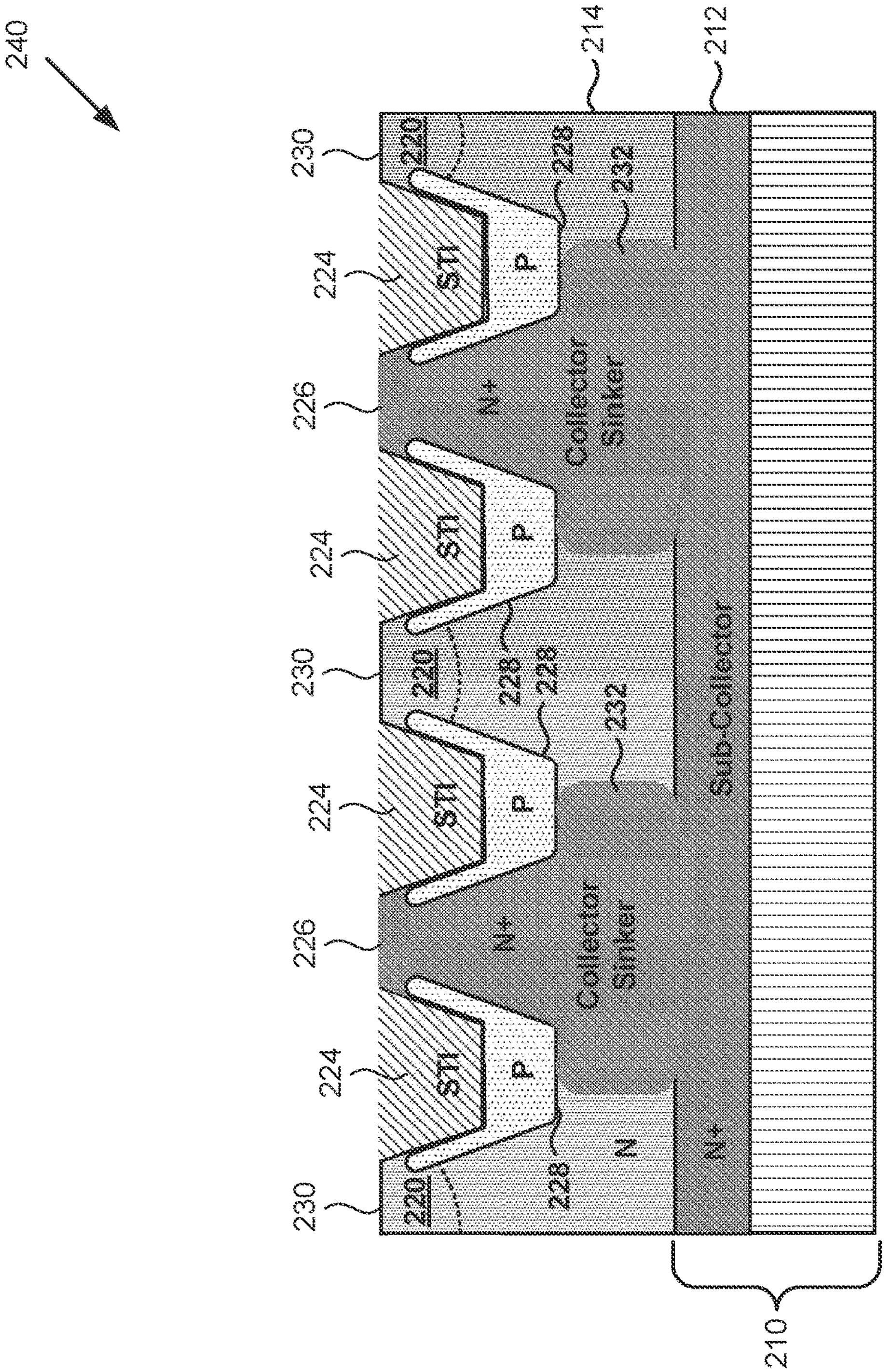
FIG. 9 shows a cross-sectional view of an exemplary structure fabricated according to the flowchart of FIG. 1, according to another implementation.

Referring to FIG. 9, FIG. 9 shows a cross-sectional view of exemplary structure 240 fabricated according to the flowchart of FIG. 1, according to another implementation. As shown by comparison of FIG. 9 with FIG. 8, structure 240 differs from structure 207 in the extent to which collector sinker regions 232 diffuse beneath RESURF regions 228. That is to say, according to the exemplary implementation shown in FIG. 9, collector sinker regions 232 may extend laterally under at least a portion of RESURF regions 228.

RESURF regions 228, which are counter-doped relative to collectors 220 and situated between collectors 220 and STIs 224, protect against breakdown of the bipolar transistors in several ways. For example, the interposition of RESURF regions 228 between collectors 220 and STIs 224 can advantageously inhibit impact ionization breakdown. Moreover, and as shown in FIGS. 8 and 9, RESURF regions 228 may extend under STIs 224 and thereby advantageously retard diffusion of dopants from collector sinker regions 232 into collectors 220. As a result, in various implementations, the breakdown voltage of a bipolar transistor fabricated according to the method outlined by flowchart 100 may be increased by up to three volts (3V) when compared with traditional bipolar transistors used in power amplifier applications. By way of a specific example, bipolar transistors capable of withstanding reverse bias voltages between the collector and base in the 15V-30V range can have those sustainable voltages raised to as much as the 18V-33V range when fabricated according to the present concepts.

Thus, the present application discloses bipolar transistors and methods for their fabrication that address and overcome deficiencies in the conventional art. The concepts disclosed herein advance the state-of-the-art by providing a RESURF region counter-doped relative to the collector of a bipolar transistor and situated between the collector and an adjacent STI. The RESURF region protects against breakdown of the bipolar transistor by increasing its breakdown voltage, while advantageously having a substantially negligible impact on device speed.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A bipolar transistor comprising:

a sub-collector situated in a semiconductor substrate, said sub-collector being doped with a first dopant type;

a device layer doped with said first dopant type situated over said sub-collector;

a shallow trench isolation (STI) situated in said device layer, said STI bordering a collector of said bipolar transistor;

a Reduced Surface Layer (RESURF) region doped with a second dopant type opposite said first dopant type, said RESURF region extending under said STI and being situated between said collector and said STI, said RESURF region being in direct contact with said collector, said RESURF region extending continuously from said collector to a bottom of said STI;

wherein said RESURF region protects against breakdown of said bipolar transistor.

2. The bipolar transistor of claim 1, further comprising a collector sinker region doped with said first dopant type and electrically coupled to said sub-collector, wherein said RESURF region retards diffusion of dopants from said collector sinker region.

3. The bipolar transistor of claim 1, wherein said first dopant type is N type and said second dopant type is P type.

4. The bipolar transistor of claim 3, wherein said sub-collector is arsenic (As) doped and said collector is phosphorus (P) doped.

5. The bipolar transistor of claim 3, wherein said RESURF region is boron (B) doped.

6. The bipolar transistor of claim 1, wherein said first dopant type is P type and said second dopant type is N type.

7. The bipolar transistor of claim 1, wherein said bipolar transistor is a silicon only bipolar transistor.

8. The bipolar transistor of claim 1, wherein said bipolar transistor is a silicon germanium (SiGe) bipolar transistor.

9. The bipolar transistor of claim 1, wherein a breakdown voltage of said bipolar transistor is increased by up to three volts (3V) due to said RESURF region.

10. A bipolar transistor comprising:

a sub-collector situated in a semiconductor substrate, said sub-collector being doped with a first dopant type;

a device layer doped with said first dopant type situated over said sub-collector;

a shallow trench isolation (STI) situated in said device layer;

a Reduced Surface Layer (RESURF) region doped with a second dopant type opposite said first dopant type, said RESURF region extending under said STI and being situated between a collector of said bipolar transistor and said STI, said RESURF region being in direct contact with said collector.

11. The bipolar transistor of claim 10, further comprising a collector sinker region doped with said first dopant type and electrically coupled to said sub-collector.

12. The bipolar transistor of claim 11, wherein said RESURF region retards diffusion of dopants from said collector sinker region.

13. The bipolar transistor of claim 10, wherein said first dopant type is N type and said second dopant type is P type.

14. The bipolar transistor of claim 13, wherein said sub-collector is arsenic doped and said collector is phosphorus doped.

15. The bipolar transistor of claim 10, wherein said RESURF region is boron (B) doped.

16. The bipolar transistor of claim 10, wherein said first dopant type is P type and said second dopant type is N type.

17. The bipolar transistor of claim 10, wherein said bipolar transistor is a silicon only bipolar transistor.

18. The bipolar transistor of claim 10, wherein said bipolar transistor is a silicon germanium (SiGe) bipolar transistor.

19. The bipolar transistor of claim 10, wherein a breakdown voltage of said bipolar transistor is increased by up to three volts (3V) due to said RESURF region.

* * * * *